United States Patent
Weber et al.

(10) Patent No.: US 7,070,649 B2
(45) Date of Patent: Jul. 4, 2006

(54) PROCESS FOR PRODUCING A SILICON SINGLE CRYSTAL WHICH IS DOPED WITH HIGHLY VOLATILE FOREIGN SUBSTANCES

(75) Inventors: Martin Weber, Kastl (DE); Peter Vilzmann, Burghausen (DE); Erich Gmeilbauer, Pantaleon (AT); Robert Vorbuchner, Burghausen (DE)

(73) Assignee: Siltronic AG, Munich (DE)

( * ) Notice: Subject to any disclaimer, the term of this patent is extended or adjusted under 35 U.S.C. 154(b) by 152 days.

(21) Appl. No.: 10/690,415

(22) Filed: Oct. 21, 2003

(65) Prior Publication Data

US 2004/0083947 A1   May 6, 2004

(30) Foreign Application Priority Data

Oct. 31, 2002   (DE) ................. 102 50 822

(51) Int. Cl.
*C30B 15/20* (2006.01)
(52) U.S. Cl. ................. 117/20; 117/13; 117/19
(58) Field of Classification Search ........... 117/13, 117/19, 20
See application file for complete search history.

(56) References Cited

FOREIGN PATENT DOCUMENTS

| DE | 1 644 009 | 9/1970 |
| WO | WO 86/03523 | 6/1986 |

OTHER PUBLICATIONS

English Derwent Abstract AN 1975-69034 W corresponding to DE 000 1644009.

A. Trainor et P.T. Harris: "The control of Resistivity in Pulled Si Crystals", Proc. of Phys. Soc, London (1959), 74 (p. 5; No. 479) , p. 669-670.
E. Schöne: „Über der EimfluB . . . , IHT-Mitteilungen I(3), 1962, p. 46-49.
Z. Liu et T. Carlberg: "A model for Dopant Conc. in CZ-Silicon Melts", J. Electrochem. Soc. vol. 140, No. 7, Jul. 1993.
W. Zwehner et D. Huber: "Czochralski—Grown Silicon", p. 26-38.
T. Izumi : "Model analysis of segregation phenomena . . . ", J. of Crystal Growth 181 (1997), p. 210-217.
ASTM : Designation F723-99 : "Standard Practice for Conversion . . . ", p. 1-17.

*Primary Examiner*—Felisa Hiteshew
(74) *Attorney, Agent, or Firm*—Brooks Kushman P.C.

(57) ABSTRACT

A process for producing a doped silicon single crystal, comprising after-doping the melt during the pulling process with a quantity of volatile dopant $\Delta N(t)$, calculated according to the equation $$\Delta N(t) = N_0 - N(t) = N_0 \cdot (1 - e^{-\lambda_a \cdot t})$$

or according to the approximation equation $$\Delta N(t) = N_0 \cdot \lambda_a \cdot t$$

where $\lambda_a$ is an evaporation coefficient which describes process-specific evaporation behavior of the foreign substance and which is obtained after a resistance profile $R(t)$ of a further single crystal has been measured and calculated according to the equation $$R(t) = R_0 \cdot e^{\lambda_a \cdot t},$$

where $R_0$ is a starting resistivity and the further single crystal is pulled under the same process conditions without being after-doped with the foreign substance.

2 Claims, 2 Drawing Sheets

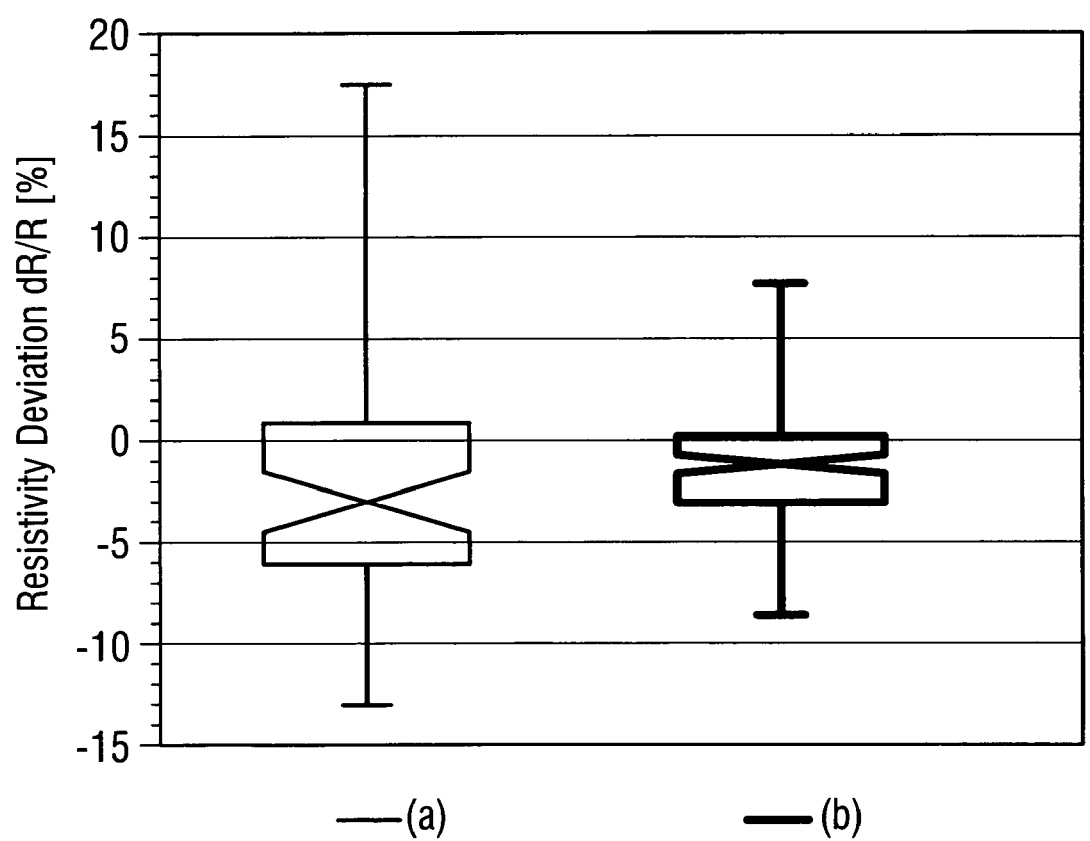

PROCESS FOR PRODUCING A SILICON SINGLE CRYSTAL WHICH IS DOPED WITH HIGHLY VOLATILE FOREIGN SUBSTANCES

BACKGROUND OF THE INVENTION

1. Field of the Invention

The invention relates to a process for producing a silicon single crystal which is doped with a highly volatile foreign substance by pulling the single crystal from a melt which is held under predetermined process conditions in a crucible, in which a quantity of the foreign substance $N_0$ is added in order to achieve a desired resistance of the melt, and the melt, after a time t, is after-doped at least once with a quantity $\Delta N(t)$ of the foreign substance, in order to compensate for losses caused by the foreign substance evaporating out of the melt.

2. The Prior Art

The Czochralski crucible pulling process (CZ crucible pulling process) and the float zone pulling process are known processes for producing high-purity single crystal ingots, in particular single-crystalline silicon ingots. The invention relates to a procedure used to produce dislocation-free silicon single crystals using the CZ crucible pulling process in which highly volatile foreign substances, in particular dopants, are used.

During crucible pulling of crystal ingots using the Czochralski process, the monocrystalline or polycrystalline semiconductor fragments which are intended to produce the melt are placed in a melting crucible. Dopants and other foreign substances are also introduced into the crucible depending on the desired physical properties of the single crystal which is to be produced. A defined resistivity is set by addition of dopants in pure form or bonded in silicon. It is also possible to adjust the crystal defect distribution and precipitations of foreign substances, for example by adding nitrogen or carbon. Then, the crucible temperature is increased by heating until the crucible contents gradually change into the molten state. The melting usually initially involves a high heating power, which is then reduced. With this procedure, it is possible to minimize the load on the crucible. The crucible position, flow rates of pressurized and inert gases are generally set in such a way that no contaminations pass into the crucible during the melting operation. For example, by using a pressure of over 50 mbar, it is possible to reduce or deliberately set the carbon content in the single crystal, which is introduced by a carbon monoxide, to well below $0.1 \times 10^{17}$ cm$^{-3}$.

In the next step, the required highly volatile or gaseous dopants are introduced into the liquid melt. This can be effected, for example, via the gas phase, with the reactive silicon melt absorbing the foreign atoms, or as a result of a suitable vessel containing solid constituents of the foreign substance being immersed into the melt. It is customary to use doping bells made from silicon or quartz glass for this purpose. Another method which is frequently used is to employ suitable tubes which extend as far as or into the melt and via which the solid or gaseous dopant is introduced. In all cases, in particular the melt temperature, the pressure and the inert gas flow rate have to be matched to the doping operation by the pulling installation. An increase in the pressure leads, for example, to a reduction in the temperature.

Balanced temperature conditions are set before the actual production of the single crystal takes place. The first doping operation can be carried out using a quantity of dopant which has been precalculated for this point of time in the process. If after-doping is required due to a number of pulling attempts being made, in each case involving remelting of the crystal, an after-doping quantity which is in each case matched to the process time that has elapsed must introduced into the melt, for example via a transfer lock.

Then, a seed crystal is dipped into the silicon melt and pulled out with rotation. The crystallographic crystal orientation is defined by means of the seed crystal. Stable pulling conditions or melt flow rates can be achieved by high crucible rotation speeds of over 10 rpm in the opposite direction to the crystal rotation. To avoid the crystal dislocations which occur as a result of a temperature shock during immersion, a thin neck with a diameter of preferably less than 6 mm is pulled at pulling speeds of preferably over 2 mm/min (dash technique) or else the required absence of dislocations is produced by special methods. This is possible, for example, by adding foreign substances which prevent the propagation of dislocations, or by deliberately adjusting the thermal conditions (preheating) in order to minimize the thermal shock. Foreign substance atoms which are larger than silicon (e.g. germanium) generally inhibit the rapid propagation of disclocations. High dopant concentrations can have a similar effect.

This is followed by the pulling of a conical transition (cone) and of a cylindrical ingot part. The semiconductor wafers for the producers of electronic components are subsequently obtained from the cylindrical ingot part. The conical growth is assisted by a deliberate reduction in the heater power. Rapid temperature changes which are required during the pulling in the transition region from the cone to the cylindrical ingot part are generally implemented by reducing the crucible rotation, since the effect of changing the heating power is too slow. When adjusting the thermal budget, it is necessary to take into account the fact that a considerable, diameter-dependent contribution is made by the heat of crystallization. A silicon single crystal with a diameter of 300 mm makes an additional contribution of approximately 2 kW at the solidification front even at a pulling rate of 0.4 mm/min.

The axial profile of the resistivity and/or the dopant concentration of highly volatile elements is usually set by means of the pressure-dependent evaporation behavior. This allows the rising concentration toward the crystal ingot end, which normally occurs on account of segregation, to be altered or even reversed. A controlled increase in the evaporation rate by reducing the pressure can be used to avoid disclocations in the growing single crystal caused by excessively high quantities of dopant.

The flow of inert gas through the pulling installation influences the dopants which are present in the gas phase and other foreign substances. The inert gas flow passed over crystal ingot, solidification area and melt, and also the gas flow guide means required for this purpose, are used to allow undesirable foreign substances in the gas phase to be removed. For example, with sufficiently high inert gas flow rates (over 2000 l/h), it is possible to significantly reduce the levels of iron contaminations. The geometry of the gas guide means can be selected in such a way that above the melt, the conditions are similar to a high overall pressure at which the evaporation of the highly volatile dopants is suppressed. For this purpose, heat shields or gas-guiding parts are installed around the single crystal at a defined distance from the melt. The provision of heat shields influences not only the pulling rate but also the cooling behavior of the single crystal and therefore also the radial and axial distribution of internal point defects and in particular their agglomerates, and also the production of precipitations of foreign substances.

An agglomeration of dopants occurs at high concentrations and may significantly interfere with the growth of the single crystal. Crystal lattice stresses caused by excessively high concentrations of foreign substances can also be deliberately compensated for by foreign substances which, on account of their atomic size, have a stress-relieving effect, as long as the other crystal properties are not adversely affected thereby. The additional foreign substances may, for example, be an additional dopant, such as boron, phosphorus, arsenic or antimony, or alternatively may also be germanium, carbon or nitrogen.

Controlling the pressure and the inert gas flow rate also affects the incorporation of oxygen in the single crystal. Oxygen is dissolved from the crucible, which consists of quartz, and is transported via the melt flow to the surface of the melt, where approximately 99% of the oxygen evaporates, while the remainder is incorporated in the growing single crystal. In principle, it is the crucible surface wetted with the melt that determines the oxygen content. By controlling the oxygen-transporting melt flows, for example by rotating the crucible, it is possible to set the oxygen content which is incorporated in the crystal. Of course, the properties of the quartz crucibles used also influence the oxygen content and even the way in which it is precipitated in the single crystal. Crucible surfaces treated with barium, for example, lead to a significantly lower oxygen precipitation.

Therefore, when pulling silicon single crystals using the CZ crucible pulling process, it is necessary to take account of the interactions between internal point defects, dopants and other foreign substances, in particular oxygen. The latter is significantly reduced inter alia by using high dopant concentrations.

In addition to the evaporation behavior of highly volatile foreign substances, it must be considered that the growth rate of the single crystal, via the segregation, has a significant influence on the incorporation of dopants and other foreign substances. Therefore, deliberate changes in the dopant concentrations can be achieved by the crystal growth. It is known that dopants and other foreign substances are incorporated in the single crystal to different extents depending on the crystal growth orientation. (100)-oriented single crystals are most commonly produced and accordingly are used for most tests.

At high dopant concentrations, depending on the cooling rate of the solidifying single crystal, agglomerates are formed, leading to harmful crystal dislocations and also to altered internal point defect distributions. For example, for arsenic-doped single crystals with a resistivity of below 3 mOhm, a sudden reduction in the void agglomerates is noticed. A similar behavior is found for highly boron-doped single crystals, which do not have any void or interstitial agglomerates in a range below 20 mOhm. Therefore, with high dopant concentrations, it is possible to suppress agglomerates of silicon interstitial atoms or voids and to control the precipitation behavior of the oxygen. A deliberate increase in the oxygen precipitation, conversely, can also be achieved, for example by adding foreign substances such as nitrogen or carbon. The concentration ranges required are $1*10^{13}$ to $1*10^{16}$ cm$^{-3}$ for nitrogen or over $1*10^{16}$ cm$^{-3}$ for carbon.

The highest concentration of foreign substances will usually occur in the ingot center of the growing single crystal and can be controlled by suitable crystal rotations and crystal pulling rates and via the radial temperature distribution in the solidifying single crystal. High crystal rotation speeds and low pulling rates generally reduce the radial variations. Rotating the single crystal and crucible in the same direction (instead of in opposite directions, as is customary) leads to the same result but increases the oxygen content considerably due to the greatly altered melt flow conditions. It is also noticeable that compared to the standard (100) orientation, the radial concentration differences of the foreign substances are very much greater with (111) single crystals. Both for the resistance-determining dopants and for the oxygen content, the values are higher, at well over 10%, in the center of the crystal than at the edge of the crystal.

After the cylindrical ingot part of the single crystal has been pulled, an end cone is pulled by increasing the power of the heater and the pulling rate. Reducing the crystal rotation speed can stabilize the pulling of the end cone. Setting the process parameters for the end cone should guarantee that the entire single crystal is free of crystal dislocations. Secondly, the thermal history of the end cone is crucial in determining the defect distribution or the precipitation behavior in the back part of the crystal ingot.

In addition to the abovementioned influences, high dopant concentrations also cause the elastic and chemical properties to change, which manifests itself in the further processing of the single crystal to form wafers. Therefore, polishing processes or etching removal operations have to be matched to the material.

The entire crystal pulling operation is usually accompanied by an optical diameter control which deliberately performs corrections in the vicinity of the solidification front by means of the crystal movement or by means of special heating elements. The heat shields are fitted in such a way that interference to the optical measurement caused by reflections is suppressed. At the same time, the distance between heat shields or heating elements and the melt can be controlled by means of optical measurement. In particular, when pulling in the end cone region of the crystal, mirrors can assist the diameter control. However, the diameter corrections can be minimized by using accurately matched heating powers for the pulling operation. However, the thermal history of the single crystal can be controlled not only by direct measurements by means of thermocouple or pyrometer, but also by means of a current-voltage measurement via crystal and melt, which simultaneously also provides information as to any melting of the single crystal.

The customer demand for silicon single crystals with high contents of highly volatile dopants has greatly increased in recent years. At the same time, the demands imposed on the quality properties of the single crystals are also growing considerably. The quality properties, such as resistivity, oxygen content or crystal defect distribution, have to be within a very narrow specified range. The predeterminable and reproducible setting of the resistivity is difficult with highly volatile dopants, such as arsenic, antimony or pure phosphorus, since the quantity which evaporates is greatly dependent on the particular process conditions used. However, the resistance-determining dopant content is a quality feature of the single crystal of crucial import, not least because axial and radial distributions of other foreign substances, such as for example oxygen, and of the crystal defects and/or their agglomerates can in this way be controlled by deliberate addition of dopants, so as to comply with the requirements of manufacturers of electronic components.

Therefore, due to the fundamental effect of the dopants, it is necessary to be able to easily and accurately determine the quantity of dopant that is required in order to achieve a desired resistance. The determination method in this case has to take account of a very wide range of process conditions and process times. At low resistivities, slightly exceeding the required dopant concentration leads to crystal dislocations and makes it necessary to make repeated pulling attempts. Subsequently, following a number of pulling attempts, it is no longer possible to produce a single-crystalline silicon ingot without an expensive new process run having to be initiated, for example on account of the limited load-bearing capacity of the crucible.

In the previous procedure, the quantities of dopant required have been roughly estimated on the basis of experience with non-volatile dopants. For such dopants, resistivities can be converted into concentrations by calculation on the basis of ASTM F723-99, and the axial concentration profile in the crystal ingot, or the required quantity of dopant, can be determined by means of simple segregation calculations. However, deviations occur even in the case of orientation-dependent segregation. It is not possible to determine the required quantity of dopant and the quantity of after-dopings required in a process-dependent manner.

In "A Model for Dopant Concentration in Czochralski Silicon Melts," J. Elektrochem. Soc., Vol. 140, No. 7, July 1993, Zhensheng Liu and Torbjörn Carlberg describe complicated theoretical calculations for the evaporation behavior of highly volatile dopants. For example, the evaporation for volatile dopants can be taken into account by an additional factor $A_{evaporate}$. This is determined from material constants of the dopant and special process conditions. However, this approach fails to take account of the actual more complicated process conditions and therefore in practice cannot be employed as a usable basis for estimating the required dopant quantities and/or the resultant axial resistivity profile.

SUMMARY OF THE INVENTION

It is therefore an object of the present invention to provide a process which allows simple estimation of the required dopant quantities under predetermined process conditions without the process conditions having to be subject to a detailed analysis in advance.

The invention relates to a process for producing a silicon single crystal that is doped with a highly volatile foreign substance by pulling the single crystal from a melt that is held under predetermined process conditions in a crucible. A quantity of the foreign substance $N_0$ is added in order to achieve a desired resistance of the melt, and the melt, after a time t, is after-doped at least once with a quantity $\Delta N(t)$ of the foreign substance, in order to compensate for losses caused by the foreign substance evaporating out of the melt, wherein the quantity $\Delta N(t)$ of the foreign substance is calculated according to the equation $$\Delta N(t) = N_0 - N(t) = N_0 \cdot (1 - e^{-\lambda_a \cdot t}) \text{ or}$$

according to the approximation equation $$\Delta N(t) = N_0 \cdot \lambda_a \cdot t$$

where $\lambda_a$ is an evaporation coefficient which describes a process-specific evaporation behavior of the foreign substance and which is obtained after the resistance profile R(t) of a further single crystal has been measured and by calculation according to the equation $R(t) = R_0 \cdot e^{\lambda_a \cdot t}$ where $R_0$ is a starting resistivity and the further single crystal is pulled under the predetermined process conditions without being after-doped with the foreign substance.

The procedure described avoids yield losses caused by deviations in resistance or by undesirable changes in quality of the single crystal caused by excessive concentrations. The method is particularly suitable for doping with highly volatile dopants, such as arsenic, antimony and phosphorus. However, the method can also be used for a controlled supply of other highly volatile foreign substances.

The axial profile of the resistivity in the silicon single crystal is substantially influenced by the following parameters, which together represent the most important process conditions: dopant quantity, effective incorporation coefficient (crystal growth rate, crystal rotation) and evaporation behavior (gas guidance, pressure, gas flow rate, temperature profile). Furthermore, the overall furnace structure contributes to the evaporation behavior of highly volatile dopants, in particular the size of the crucible, due to the fact that the free melt surface area is dependent thereon.

According to the present invention, the evaporation behavior is approximately described by means of a coefficient $\lambda_a$, the coefficient being calculated for predetermined process conditions from the resistance profile which is found in a single crystal that has been pulled under the same conditions without after-doping.

The number of evaporated particles $N_a$ or the time-dependent reduction in the number of particles N(t) can be represented as:

$$N_a = -\lambda_a \cdot N \Rightarrow N(t) = N_0 \cdot e^{-\lambda_a \cdot t}$$

The evaporation coefficient $\lambda_a$ includes the prevailing physical conditions. $N_0$ denotes the initial number of particles. The change in concentration in the melt caused purely by evaporation is:

$$N = C \cdot V \Rightarrow N_a = -\lambda_a \cdot V \cdot C$$

$$C \cdot V - \lambda_a \cdot V \cdot C = 0 \Rightarrow \ln\left(\frac{C}{C_0}\right) = -\int_0^t \lambda_a \cdot dt \Rightarrow C(t) = C_0 \cdot e^{-\lambda_a \cdot t}$$

The time-dependent profile of the concentration C or of the dopant mass N of highly volatile dopants in the melt can therefore similarly be described in simplified form:

$$N(t) = N_0 e^{-\lambda_a \cdot t}$$

where $N_0$ is the dopant quantity without taking into account the evaporation of dopant.

The following relationship approximately applies to the resistivity produced in the single crystal:

$$R(t) \propto \frac{1}{C(t)} \propto \frac{1}{N(t)} \Rightarrow R(t) = R_0 \cdot e^{\lambda_a \cdot t}$$

According to the invention, the evaporation coefficient $\lambda_a$ is determined from the measured resistance profile R(t) of a single crystal produced under defined process conditions, and then this coefficient is used in a process under the same process conditions to exactly calculate the after-doping quantity $\Delta N$ required, using the following determination equation:

$$\Delta N(t) = N_0 - N(t) = N_0 \cdot (1 - e^{-\lambda_a \cdot t})$$

In practice, linear approximation is sufficient to determine the process-specific after-doping quantity $\Delta N$ required as a function of the elapsed time t since the last doping, which represents the following equation:

$$\Delta N(t) = N_0 \cdot \lambda_a \cdot t.$$

The determination method allows automation by integration in the control of the crystal pulling installation. The precalculated or current process parameters, for example the time since the doping operation, pressure and inert gas flow rates or the influence by the furnace structure can also be used to exactly calculate the quantity of dopant. Then, the calculated dopant quantity can be introduced or can be added in some other form, for example as a metered addition forming a continual correction, during the melt process.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views:

FIG. 2 shows a statistical analysis of the deviation in the resistivity at the start of the crystal ingot, both with and without the use of the process-specific dopant quantity calculation according to the invention.

DETAILED DESCRIPTION OF THE PREFERRED EMBODIMENT

Figure 1:
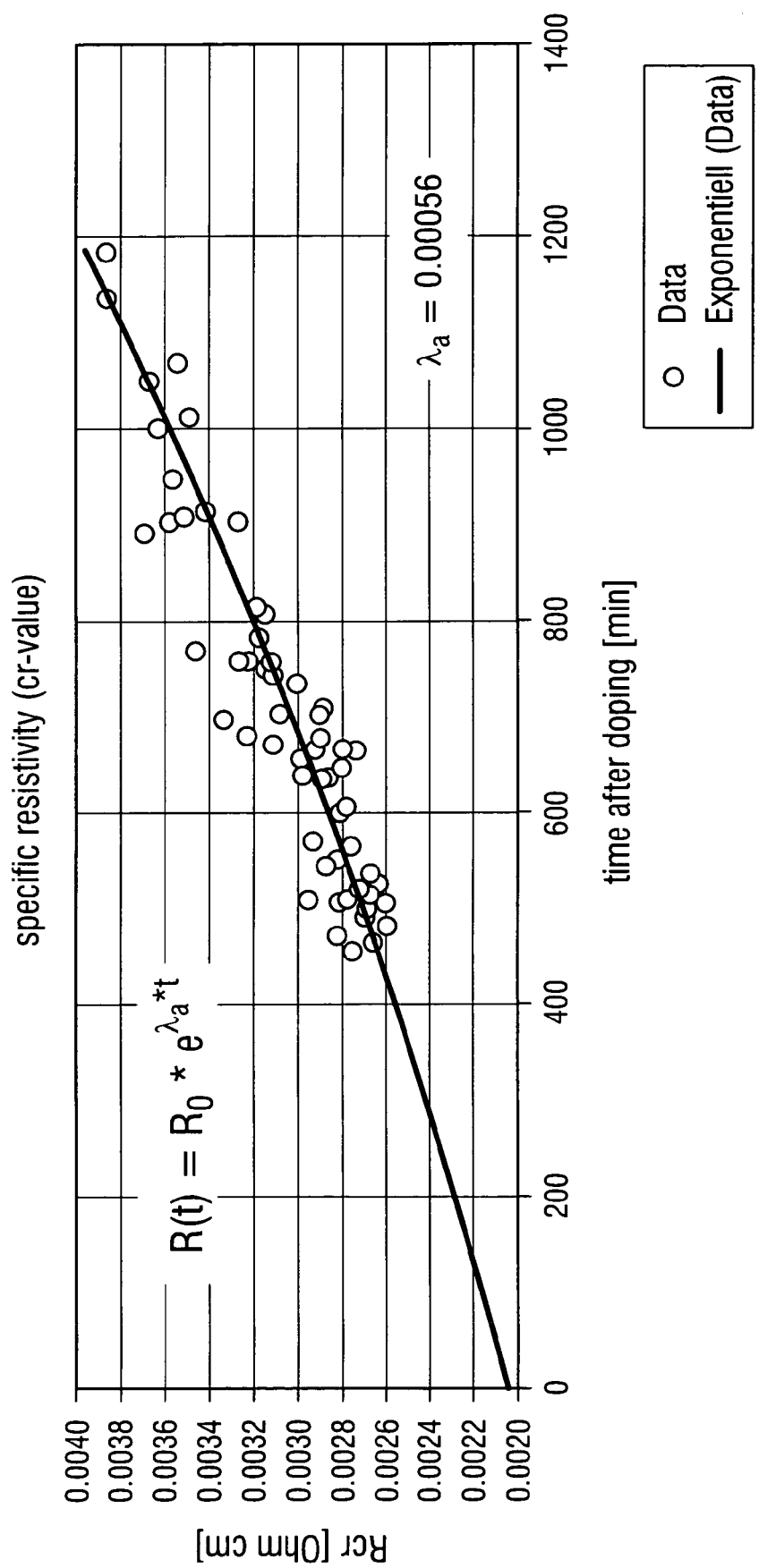
FIG. 1 shows a graph of the resistance measurement as a function of the axial position in the crystal ingot according to the invention.

The systematic determination of the dopant quantity required comprises the following steps: the quantity of dopant $N_0$ required for a resistivity (desired resistance) which is to be achieved is calculated without taking account of the evaporation by means of concentration or resistance conversion calculation and segregation. The term segregation denotes the phenomenon whereby a different concentration C is found in a (slowly) solidified melt than was previously present in the melt:

$$C_{solid} = k_0 \cdot C_{liquid}$$

using the incorporation coefficient $k_0$ for normal solidification.

The conversion of the resistivity into a dopant concentration and vice versa by calculation expediently takes place using ASTM F 723-99 and DIN 50 444 or the updated versions thereof. Deviations in particular at very high dopant concentrations, as well as any element-specific details, should be taken into account. However, for elemental estimates it can be assumed that the resistivity and concentration of foreign substances behave inversely proportionally to one another.

Furthermore, the evaporation coefficient $\lambda_a$ is calculated. To do this, it is necessary to measure the resistivity of a single crystal pulled under predetermined process conditions without after-doping as a function of the crystal ingot position and therefore of the evaporation time. The result of a measurement of this type is illustrated in FIG. 1. The evaporation coefficient $\lambda_a$ with a value of 0.00056, which results from the resistance measurement in combination with the equation given above, includes all the process conditions and can therefore be used for a subsequent determination of doping quantity as a function of process time in a subsequent pulling process under the same process conditions.

For this purpose, the measured evaporation coefficient $\lambda_a$ is used to correct the dopant quantity $N_0$ by the evaporated quantity $\Delta N(t)$ and therefore to provide a process-specific specification for the required dopant quantity taking account of the evaporation, in which context $\Delta N(t)$ is calculated with the aid of the equation $$\Delta N(t) = N_0 - N(t) = N_0 \cdot (1 - e^{-\lambda_a \cdot t})$$

or with the aid of the approximation equation $$\Delta N(t) = N_0 \cdot \lambda_a \cdot t.$$

The required resistivity (desired resistance) can therefore once again be set accurately at any time despite the time-dependent evaporation of the dopant, so that there are no yield losses caused by deviations. The customer-specified upper resistance limits can be reproducibly observed by means of the after-doping method described, and changes in the quality of the single crystal caused by dopant concentration deviations can be avoided.

FIG. 2 shows a statistical analysis of the deviation in the resistivity at the start of the crystal ingot (a) without and (b) with use of the process-specific dopant quantity calculation according to the invention. The scatter in the resistances is significantly lower when using the process according to the invention. Accordingly, higher crystal yields and fewer dopant-accompanying deteriorations in the crystal quality are obtained.

Accordingly, while only a few embodiments of the present invention have been shown and described, it is obvious that many changes and modifications may be made thereunto without departing from the spirit and scope of the invention.

What is claimed is:

1. A process for producing a silicon single crystal that is doped with a highly volatile foreign substance, comprising:
    adding a quantity of the foreign substance $N_o$ to a melt, said foreign substance being in elemental or molecular form and containing at least one element selected from the group consisting of arsenic, antimony and phosphorous;
    pulling a single crystal from the melt under process conditions in a crucible;
    after-doping the melt at a time t at least once during the pulling process, with a quantity $\Delta N(t)$ of the foreign substance, in order to compensate for losses caused by the foreign substance evaporating out of the melt, wherein the quantity $\Delta N(t)$ of the foreign substance is calculated according to the equation:

$$\Delta N(t) = N_0 - N(t) = N_0 \cdot (1 - e^{-\lambda_a \cdot t})$$

or according to the approximation equation:

$$\Delta N(t) = N_0 \cdot \lambda_a \cdot t$$

where $\lambda_a$ is an evaporation coefficient which describes a process-specific evaporation behavior of the foreign substance and which is obtained after a resistance profile R(t) of a further single crystal has been measured and by calculation according to the equation:

$$R(t) = R_0 \cdot e^{\lambda_a \cdot t}$$

where $R_0$ is a starting resistivity and the further single crystal is pulled under the process conditions without being after-doped with the foreign substance.

2. The process as claimed in claim 1, wherein the evaporation coefficient $\lambda_a$ is integrated in an automatic process control.

* * * * *